(12) United States Patent
Bruel

(10) Patent No.: US 8,420,506 B2
(45) Date of Patent: Apr. 16, 2013

(54) PROCESS FOR CLEAVING A SUBSTRATE

(75) Inventor: Michel Bruel, Veurey Voroize (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/306,591

(22) Filed: Nov. 29, 2011

(65) Prior Publication Data

US 2012/0161291 A1 Jun. 28, 2012

(30) Foreign Application Priority Data

Dec. 22, 2010 (FR) ...................................... 10 61052

(51) Int. Cl.
*H01L 21/30* (2006.01)

(52) U.S. Cl.
USPC ..... 438/459; 438/458; 438/455; 438/E21.568

(58) Field of Classification Search .......... 438/455–459, 438/445, 478
See application file for complete search history.

(56) References Cited

U.S. PATENT DOCUMENTS

| | | | |
|---|---|---|---|
| 5,374,564 A | 12/1994 | Bruel | 437/24 |
| 2006/0234486 A1 | 10/2006 | Speck et al. | 438/590 |
| 2007/0249140 A1 | 10/2007 | Dross et al. | 438/458 |
| 2009/0277314 A1 | 11/2009 | Henley | 83/15 |
| 2010/0227452 A1* | 9/2010 | Akiyama et al. | 438/458 |
| 2010/0323472 A1 | 12/2010 | Dross et al. | 438/96 |
| 2011/0048516 A1 | 3/2011 | Bedell et al. | 136/255 |
| 2011/0048517 A1 | 3/2011 | Bedell et al. | 136/255 |

FOREIGN PATENT DOCUMENTS

| | | |
|---|---|---|
| EP | 0 533 551 A1 | 3/1993 |
| WO | WO 2011/106203 A2 | 9/2011 |

OTHER PUBLICATIONS

French Search Report, FR 1061052, mailed May 12, 2011.
Bruns, T.E. et al., "Toward the Topology Design of Mechanisms that Exhibit Snap-Through Behavior", Comput. Methods, Appl. Mech. Engrg, pp. 1-23 (2004).
Lakes, R., "Dense Solid Microstructures with Unbounded Thermal Expansion", J. Mechanical Behav. Mts., vol. 7, pp. 85-92 (1996).
Lakes, R., "Cellular Solid Structures with Unbounded Thermal Expansion", Journal of Materials Science Letters, vol. 15, pp. 475-477 (1996).
Sigmund, O. et al., "Design of materials with Extreme Thermal Expansion Using a Three-Phase Topology Optimization Method", J. Mech. Phys. Solids, vol. 45, No. 6, pp. 1037-1067 (1997).
Sigmund, O. et al., "Composites with Extremal Thermal Expansion Coefficients", Appl. Phys. Lett., vol. 69, No. 21, pp. 3203-3205 (1996).

* cited by examiner

*Primary Examiner* — Dung A. Le
(74) *Attorney, Agent, or Firm* — Winston & Strawn LLP

(57) ABSTRACT

A process for cleaving a substrate for the purpose of detaching a film therefrom. The method includes the formation of a stress-generating structure locally bonded to the substrate surface and designed to expand or contract in a plane parallel to the substrate surface under the effect of a heat treatment; and the application of a heat treatment to the structure, designed to cause the structure to expand or contract so as to generate a plurality of local stresses in the substrate which generates a stress greater than the mechanical strength of the substrate in a cleavage plane parallel to the surface of the substrate defining the film to be detached, the stress leading to the cleavage of the substrate over the cleavage plane. Also, an assembly of a substrate and the stress-generating structure as well as use of the assembly in a semiconductor device for photovoltaic, optoelectronic or electronic applications.

21 Claims, 5 Drawing Sheets

PROCESS FOR CLEAVING A SUBSTRATE

FIELD OF THE INVENTION

The present invention relates to a process for cleaving a substrate such as a semiconductor substrate for the purpose of detaching a film of a useful layer of material from the substrate typically for transferring the useful layer to another substrate.

BACKGROUND OF THE INVENTION

The detachment of thick films from a substrate is performed particularly in the semiconductor industry. Various detachment processes are already known and widely employed. Certain processes comprise the formation, within the substrate, of a weakened zone defining the film to be detached followed by the application of stresses to the substrate or to the weakened zone so as to cleave the substrate in the weakened zone. These stresses may be of thermal origin and/or mechanical origin, etc.

One particular process is known as the SmartCut™ layer transfer process, which comprises the formation, in a donor substrate, of a weakened zone by implanting atomic species, defining the film to be transferred, followed by the bonding of the donor substrate to a receiver substrate and the cleavage of the donor substrate in the weakened zone, resulting in the film being transferred onto the receiver substrate. This process is more appropriate for transferring thin films, that is to say films or usefully layers typically having a thickness of less than 1 micron.

Industrial implanters currently are designed to provide an energy of up to 200 keV, thereby achieving an implantation depth of possibly up to about 2 microns, depending on the materials and the ionic species implanted. For example, by implanting H$^+$ ions into silicon it is possible to achieve a depth of about 1.8 microns, but the depth to be achieved will be smaller in other substrates, such as GaN, which is denser.

There are high-energy implanters, i.e., operating at around 1 MeV, which would allow a depth of up to 20 microns to be achieved, but the process is not economically viable because of the high cost of these machines. Accordingly, there is a need for lower cost alternatives for implanting at greater depths in the substrate.

US Patent application publication 2007/0249140 describes a method of detaching a layer from a silicon substrate, in which a metal layer, in particular a silver and/or aluminium paste, is deposited on the surface of the substrate. Applying a thermal stress to the substrate covered with the metal layer generates a cleavage stress in the substrate at a depth corresponding to the thickness of the layer that is intended to be detached, resulting in the cleavage of the substrate and detachment of the desired layer.

The cleavage stress obtained depends on the difference in thermal expansion coefficient (TEC) between the material of the metal layer and the material of the substrate. Thus, for example, thermal expansion coefficient of silicon is $4.6 \times 10^{-6} K^{-1}$ whereas that of silver is $20 \times 10^{-6} K^{-1}$ and that of aluminium is $24 \times 10^{-6} K^{-1}$.

Depositing metals on the silicon substrates runs the risk of contaminating the semiconductor layer, however, and this would be prejudicial to the operation of the device fabricated from this layer. Moreover, thermal expansion coefficient of the stress-generating layer depends on the nature of the material employed. As a result, a person skilled in the art is necessarily limited in the definition of the process by the materials that are commercially available. In particular, he may necessarily be unable to form a stress-generating layer having the desired thermal expansion coefficient.

Finally, to make the stress-generating layer expand according to the aforementioned method, it is generally necessary to heat it to a high temperature such as typically around 800° C. In this temperature range, however, silicon is ductile, making it unfavourable for cleaving the substrate. Thus, there is a need for a layer transfer process that can detach a film from a substrate when the film typically having a thickness of between 1 and 100 microns, wherein the process avoids the drawbacks of the abovementioned prior art methods. The present invention now provides such a process.

SUMMARY OF THE INVENTION

In accordance with the invention, what is proposed is a process for cleaving a substrate for the purpose of detaching a film therefrom. The process includes the initial formation or other provision of what is called a stress-generating structure, locally bonded to the substrate surface and designed to expand or contract in a plane parallel to the substrate under the effect of a heat treatment. Thereafter, the process includes the application of a heat treatment to the structure, designed to cause the structure to expand or contract so as to generate a plurality of local stresses in the substrate. The plurality of stresses combine to generate a stress in the substrate that is greater than the mechanical strength of the substrate in a cleavage plane parallel to the surface of the substrate defining the film to be detached, such that the stress facilitates cleavage of the substrate at the cleavage plane to detach the film from the substrate.

The invention enables a film of the desired thickness to be detached from the substrate without the risk of contaminating the material of the substrate. This is achieved without a significant increase in the temperature needed to cleave the substrate. Furthermore, the invention also provides a greater freedom of choice in thermal expansion coefficient of the stress-generating structure, in particular for the purpose of optimally cleaving the substrate.

The invention also relates to an assembly of a substrate and a stress-generating structure of a cellular structure having cells, the walls of which are perpendicular to the substrate surface and are composed of at least two materials having different thermal expansion coefficients suitable for allowing the walls to deform under the effect of a heat treatment.

The invention further relates to a semiconductor device for photovoltaic, optoelectronic or electronic applications that includes the assembly.

BRIEF DESCRIPTION OF THE DRAWINGS

Other features and advantages of the invention will become apparent from the following detailed description, with reference to the appended drawings in which.

Figure 1:
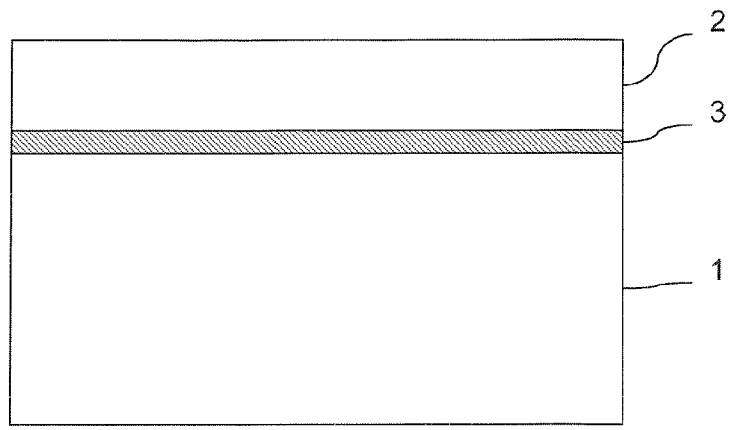
FIG. 1 is a sectional view of a substrate and a stress-generating structure according to the invention.

To make it easier to examine the illustrations, the ratios of the thickness of the various layers have not necessarily been respected.

DETAILED DESCRIPTION OF THE INVENTION

In the present invention, the term "bonded" is understood in the present text to mean that the cohesion force between the stress-generating structure and the surface of the substrate must be greater than the stresses exerted during expansion or contraction of the structure, so that there is no rupture at the interface and that the stresses generated by deforming the structure are transmitted to the substrate in order to cleave it.

The term "locally" is understood to mean that the bond between the stress-generating structure and the substrate exists only in defined regions of the surface of the substrate and not at all points on the surface of the substrate.

Particularly advantageously, the stress-generating structure of the invention is a cellular structure, composed of a plurality of cells, the walls of which are perpendicular to the substrate surface and are composed of at least two materials having different thermal expansion coefficients designed to allow the walls to deform under the effect of the heat treatment, thus providing a bimaterial strip effect.

The expression "providing a bimaterial strip effect" is understood in the present text to mean that two materials having different thermal expansion coefficients are placed so as to be bonded to each other in such a way that the assembly deforms by expanding or contracting, under the effect of a heat treatment and, optionally, of a magnetic field if one of the materials is also magnetostrictive.

According to the embodiments described herein, the two materials may take the form of two strips bonded together, the interface between the two materials having a surface substantially perpendicular to the surface of the substrate.

By extension, the term "bimaterial strip" is also understood to mean any arrangement of two or more materials having different expansion coefficients, in the form of multiple strips bonded together, the interfaces between each of the materials being in the form of a surface substantially perpendicular to the surface of the substrate. This definition therefore includes a trimaterial strip composed for example of a central strip of silicon surrounded by two strips of different material, e.g., one strip of a material having a positive TEC and one strip of a material having a negative TEC.

According to one embodiment of the invention, the walls of the cells are bimaterial strips formed from first and second materials that have thermal expansion coefficients differing by a ratio of at least 2. For example, the stress-generating structure advantageously comprises bimaterial strips formed from the following pairs of materials: Si/Ag, Si/Al, Si/Cu, Si/SiO$_2$, Ge/Ag, Ge/Al, Ge/Cu, Ge/Fe, Ge/SiO$_2$, sapphire/Ag, sapphire/Al, sapphire/Cu and/or sapphire/SiO$_2$.

According to another embodiment, the walls of the cells are bimaterial strips formed from first and second materials, one having a positive thermal expansion coefficient and the other a negative thermal expansion coefficient. For example, these bimaterial strips can be formed from the following pairs of materials: Si/ZrW$_2$O$_8$, Cu/ZrW$_2$O$_8$, Al/ZrW$_2$O$_8$ or Ag/ZrW$_2$O$_8$.

According to another embodiment, the first and second materials of the bimaterial strip are separated by a void or by a strip of a third material, in particular the bimaterial strip being formed by the Ag/ZrW$_2$O$_8$ pair and the strip of the third material being silicon. This is another version of a trimaterial strip where two outer strips are the same and are of a different material than the center strip.

Particularly advantageously, the heat treatment is applied at a temperature of between 20 and 500° C.

According to one particularly advantageous embodiment of the invention, the stress-generating structure is furthermore designed to expand or contract in a plane parallel to the surface of the substrate under the action of a magnetic field. For this purpose, the stress-generating structure is a cellular structure having a plurality of cells, the walls of which are perpendicular to the surface of the substrate and are composed of at least two materials having different thermal expansion coefficients. These materials are designed to allow the walls to deform under the effect of the heat treatment with one of the materials being a magnetostrictive material. Preferably, the magnetostrictive material is a rare-earth/iron alloy, such as terfenol-D, SmFe$_2$, DyFe$_2$ or TbFe$_2$, and the other material is silicon, SiC or germanium.

In this case, preferably the heat treatment is applied at a temperature below the Curie temperature of the magnetostrictive material and a magnetic field is also applied to the stress-generating structure, suitable for causing the magnetostrictive material to elongate or contract. If the substrate has an elongate shape, the applied magnetic field is preferably static and oriented parallel to the largest dimension of the substrate. If the substrate is in the form of a disc, the applied magnetic field is a rotating field so as to make the structure expand or contract in two directions perpendicular to the plane parallel to the surface of the substrate.

According to one particular embodiment of the invention, the stress-generating structure is bonded to the surface of the substrate by a bonding layer. The stress-generating structure, before being bonded to the substrate, may be fabricated by etching trenches in a layer of the first material, filling the trenches with the second material, masking portions of the layer of the first material that are intended to form the bimaterial strip, and selectively etching the layer so as to remove the non-masked portions of the first material.

Alternatively, the stress-generating structure is bonded to the substrate by depositing a layer of the first material onto the surface of the substrate, followed by the etching of the trenches in the layer, the filling of the trenches with the second material, the masking of the portions of the layer of the first material that are intended for forming the bimaterial strip and the selective etching of the layer so as to remove the non-masked portions of the first material.

The thickness of the film to be detached from the substrate is between 1 and 100 microns, preferably between 30 and 70 microns, for example about 50 microns. Typically, the ratio of the thickness of the film to be detached to the thickness of the stress-generating structure is between 0.1 and 10.

According to one particular embodiment, before the application of a heat treatment to the structure, a weakened zone is formed in the substrate so that the heat treatment causes the cleavage through the weakened zone. For example, the weakened zone is formed by ion implantation in the substrate at the depth of the cleavage plane with a dose of between $5 \times 10^{15}$ and $10^{16}$ atoms/cm$^2$. Alternatively, the substrate and the film to be detached are made of silicon and the weak zone is a layer of Si$_x$Ge$_{1-x}$ where $0 < x < 0.8$, in which the proportion of germanium gradually changes between a minimum value at the interfaces and a maximum value at the center.

According to one embodiment, before applying the heat treatment, a fracture initiator is produced in the substrate at the depth of the cleavage plane. Before forming the stress-generating structure, electronic devices may be formed in or on the film to be detached from the substrate, the devices being for optoelectronic or photovoltaic or power applications or for electronic circuits or for microsytsems.

The stress-generating structure may be removed from the film after the latter has been detached from the substrate. For example, the stress-generating structure may be recycled after its removal from the detached film, for the purpose of using it again to cleave a further substrate.

Typically, the substrate is made of a semiconductor material. According to one particular embodiment of the invention, the substrate is an ingot and the process is applied several times for successively detaching a plurality of films from the substrate.

The structure resulting from conducting the process after forming a stress-generating structure locally bonded to the substrate surface results in a useful assembly. As discussed herein, the stress-generating structure is a cellular structure having a plurality of cells, the walls of which are perpendicular to the surface of the substrate and are composed of at least two materials having different thermal expansion coefficients suitable for allowing the walls to deform under the effect of a heat treatment.

Finally, another subject of the invention is a semiconductor device for photovoltaic, optoelectronic or electronic applications, comprising a film of semiconductor material and a support which is a cellular structure bonded to the surface of the film, the walls of the cells of which are perpendicular to the surface of the film and are composed of at least two materials having different thermal expansion coefficients suitable for allowing the walls to deform under the effect of a heat treatment.

The details of the process of the invention are now provided in the following description of various process steps for preferred embodiments.

Cleaving Process

Referring to FIG. 1, a structure 2, suitable for deforming under the application of a heat treatment, is formed on the substrate surface 1. The substrate may be any material (semiconductor, metal, etc.) and of any crystalline structure (i.e., single-crystal, polycrystalline, or amorphous). Preferably, the substrate is made of a semiconductor material, such as Si, SiC or Ge, a substrate of the IV, II/VI or III/V type, such as GaN, InGaN, GaAs or InP, and other binary, ternary or quaternary alloys of these elements.

According to one particular embodiment, the film that has to be detached from the substrate is an active film formed by a plurality of superposed semiconductor materials and/or comprises electronic devices for optoelectronic applications (for example for LEDs or lasers) and/or photovoltaic applications (such as multijunction cells for terrestrial and space applications). The film may also comprise electronic circuits, in particular for power applications and/or microsystems. The devices are formed in or on the film to be detached before the stress-generating structure is bonded to the substrate.

This structure must be bonded to the surface of the substrate so as to transmit thereto the stresses that will result in cleavage of the substrate. A suitable method of bonding between the structure and the substrate is therefore chosen. Depending on the materials present, the bonding may be carried out by molecular adhesion (usually called direct bonding), by soldering or by an appropriate adhesive, especially one having good resistance to the temperature of the heat treatment that will be carried out in order to result in cleavage of the substrate.

When the structure must be removed from the film that will be detached from the substrate, it is preferable to provide a reversibly bonding adhesive, i.e. one that will allow the structure to be dismantled non-destructively. For example, the adhesive employed is an epoxy adhesive. Such an adhesive has the advantage of being hydrolysable such that it can therefore be removed through the action of steam at 100° C.

In the embodiment illustrated in FIG. 1, the structure 2 is bonded to the surface of the substrate 1 by means of a bonding layer 3. However, the bonding layer is optional and, depending on the materials in question, a direct molecular bonding operation may be carried out by bringing the stress-generating structure directly into contact with the surface of the substrate. For this, the surfaces of the stress-generating structure and substrate are planarized or otherwise smoothed so that they bond together simply by contact.

The structure 2 of the stress-generating structure is a cellular structure as illustrated for example in FIG. 3, and a process for producing this structure is provided in detail later. The walls 2" of the cells 2' consist of bimaterial strips (or even trimaterial strips) of materials having significantly different thermal expansion coefficients, the walls being perpendicular to the surface of the substrate. The term "significantly different" is understood to mean that there is for example a ratio of about 2 or more between thermal expansion coefficients of the two materials or that thermal expansion coefficients of the materials are of opposite sign. The interface between the stress-generating structure and the substrate is limited to the regions where the walls of the cells are in contact with the substrate, so that the stress-generating structure is locally bonded to the substrate.

To cause of the cleavage of the substrate, a heat treatment is applied at a temperature suitable for causing the structure 2 to deform in the two directions of a plane parallel to the surface of the substrate 1. Owing to the geometry of the cellular structure, which gives it a very high thermal expansion coefficient, a temperature of between 20 and 500° C. is generally sufficient to deform the structure. The temperature is also chosen according to the nature of any adhesive bonding the structure to the substrate, so as not to degrade it. Thus, if the adhesive is an epoxy adhesive, it is preferably applied at a temperature below 300° C.

Figure 2:
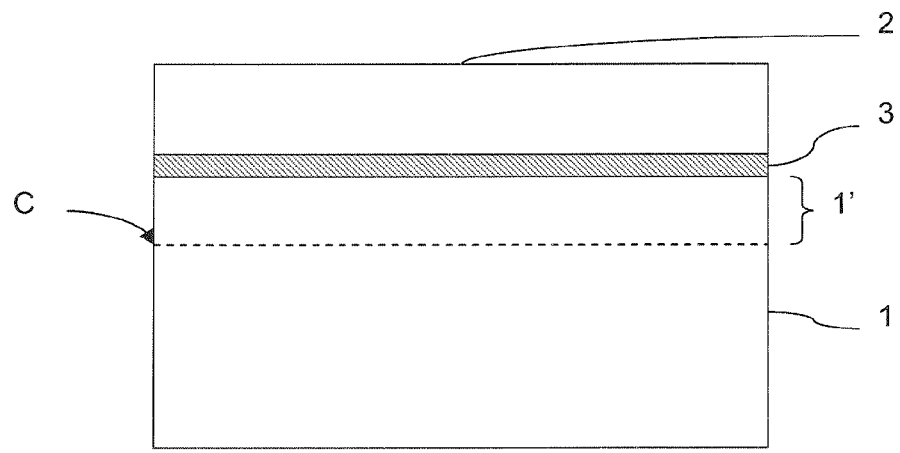
FIG. 2 is a sectional view of the cleaved substrate of FIG. 1 and the structure.

Since the structure 2 is bonded to the substrate 1, this deformation generates a stress in the substrate that is greater than the mechanical strength of the material of the substrate, resulting in its cleavage in a plane (C) parallel to the surface of the substrate, lying at a certain depth below the stress-generating cellular structure. The thinner the substrate, the more flexible it is and the deeper the cleavage plane will be in the substrate. In contrast, a thicker substrate will give rise to shallower cleaving. As may be seen in FIG. 2, the cleavage plane C defines a film 1' that can then be detached for subsequent usage, possibly by applying a mechanical force to separate it from the rest of the substrate.

Once the film 1' has been detached, the structure 2 that has served for cleaving can be removed. If the structure 2 is not intended to be reused, it can be removed destructively, for example by mechanical and/or chemical removal of material. It is also possible for the structure 2 to be reused, however, in which case it is removed from the film 1' non-destructively (for example by etching the adhesive used to bond the structure to the substrate) and then prepared (for example by gentle polishing) for the purpose of reusing it. Reuse is advantageous in particular when the structure 2 is expensive or made of an expensive material, of it is specially designed for transfer of many layers of material such that its re-use contributes to the economics of the overall process.

Another possibility is for the structure 2 to not be separated from the film or useful layer 1' that has been detached, in particular if the structure has fulfilled a function during the subsequent use of the detached film. Thus, for example, the structure 2 may be preserved and serve as support for a photovoltaic film, with the advantage that its transparent structure enables electrical contacts to be made on the back side of the photovoltaic film. The structure 2 may also serve for stiffening the detached film 1', in particular when it has too small a thickness to be self-supporting (i.e. able to be handled independently), that is to say typically when its thickness is less than 50 microns.

If appropriate, the remaining portion of the substrate may be prepared for being bonded to a new or recycled stress-generating structure in order to detach a further film from that substrate. The process thus makes it possible for a substrate such as an ingot to be progressively cut into a plurality of films.

A first advantage of this process is that the structure employed allows great freedom of choice in defining its thermal expansion coefficient. In particular, the criteria for defining thermal expansion coefficient are not just the materials employed, but also the shape and the dimensions of the cells. A second advantage is that the structure employed has a much higher thermal expansion coefficient than the individual thermal expansion coefficients of the materials constituting it. Moreover, by judiciously choosing the materials and the geometry of the structure it is possible, depending on the requirements, to form a structure having a positive or a negative thermal expansion coefficient.

Consequently, heating to a lower temperature than in the prior art is sufficient to generate a stress in the substrate higher than its mechanical strength. Thus, when the substrate is made of silicon, it is brittle at room temperature. The application of stresses via the substrate therefore results in easier cleavage of the substrate than if it were at a temperature above 500° C., i.e. above a brittle-ductile transition of silicon. Moreover, this heat treatment at lower temperature is more favorable for any devices that will be formed in or on the detached film, since there is no risk of damaging them or affecting their performance.

Cellular Structure

Figure 3:
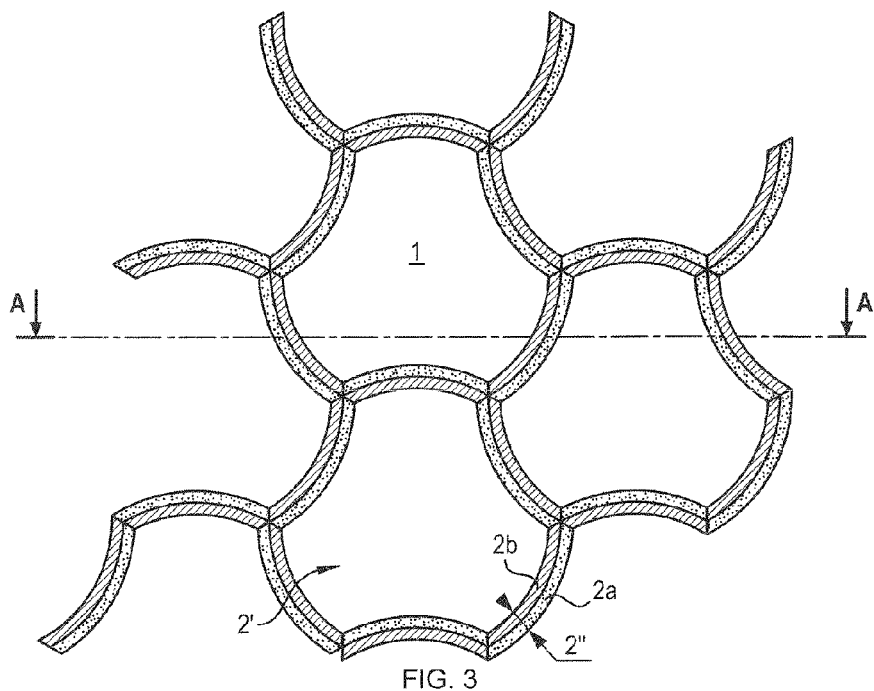
FIG. 3 is a top view of one particular embodiment of the invention, in which the structure is formed from a plurality of cells, the walls of which are bimaterial strips.

According to one embodiment illustrated in FIG. 3 in top view, the stress-generating structure is a cellular structure comprising a plurality of cells 2', the walls 2" of which are bimaterial strips 2a, 2b perpendicular to the surface of the substrate 1. Each bimaterial strip consists of a first material 2a having a first thermal expansion coefficient and a second material 2b having a second thermal expansion coefficient significantly different from the first.

Advantageously, the cells are identical and are repeated in a defined pattern in a plane parallel to the surface of the substrate. The cells 2' typically have a suitable shape for being able to deform on two directions in a plane parallel to the surface of the substrate. In the example illustrated in FIG. 3, the cells have a substantially hexagonal shape, with successively concave and convex walls, and in which the material lying on the internal side of the cell is alternately the material 2a and the material 2b. The walls of the cells are not straight but are arcuate, but either one is useful according to the invention. Other shapes of cells, such as octagonal or other shapes, however, may be envisaged without thereby departing from the scope of the present invention. For example, one can use mathematical methods which are published in the scientific literature to define the shape and dimensions of any cells that can be used in the invention.

A process for fabricating the cellular structure shown in FIG. 3 is described with reference to FIGS. 4A to 4E, which are views on the line of section A-A of FIG. 3. The first step, illustrated in FIG. 4A, starts with a layer of the first material 2a. For example, the layer is a layer of silicon 50 µm in thickness. This layer is deeply etched so as to create trenches T1, T2, T3, the path of which defines the walls of these cells.

The shape and dimensions of the cells will have been defined beforehand according to the required thermal expansion properties. For this purpose, the size may be based on the following publications: "Cellular solid structures with unbounded thermal expansion" by R. Lakes, Journal of Material Science Letters, 15, 475-477 (1996); and "Toward the topology design of mechanisms that exhibit snap-through behaviour" by T. E. Bruns and O. Sigmund, Computer Methods in Applied Mechanics and Engineering, Vol. 193, Issues 36-38, 10 Sep. 2004, pp. 3973-4000. The width of the trenches is for example 10 µm.

Figure 4A:
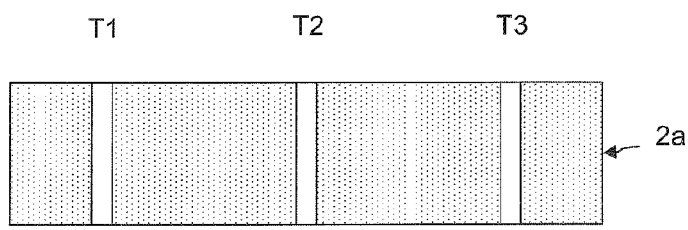
FIGS. 4A to 4E illustrate steps of the process for producing the structure of FIG. 3.
Figure 4B:
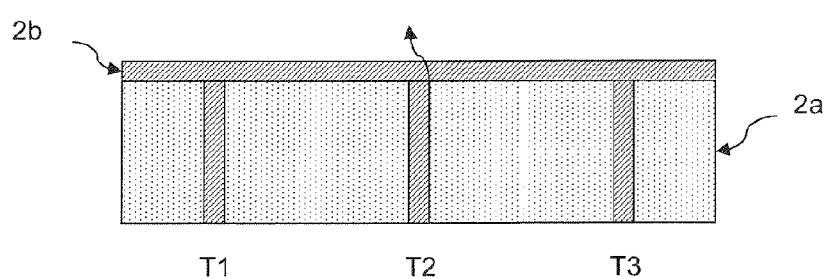

In the second step, illustrated in FIG. 4B, a second material 2b deposited, after a metal tie layer (for example around 10 mm of titanium) has been deposited by vacuum evaporation or sputtering on the walls of the trenches. For example, the second material is a metal (such as aluminium or silver) having a thermal expansion coefficient greater than that of silicon. This deposition operation has the effect of filling the trenches T1, T2, T3 of the second material 2b and also of covering the surface of the first material 2a with a layer of the second material 2b.

Figure 4C:
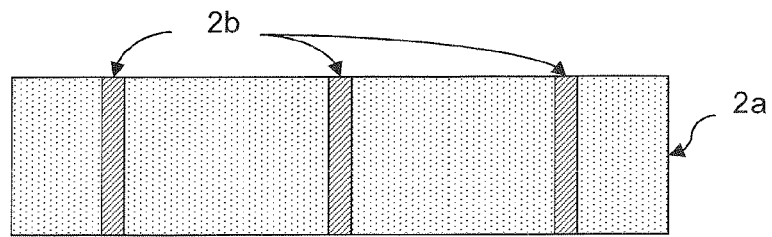

In the third step, illustrated in FIG. 4C, the excess second material covering the surface of the first material 2a is removed by CMP (chemical-mechanical polishing). At this stage, a thermal annealing operation is optionally carried out at low temperature (i.e., typically at around 200° C. in the case of aluminium) in an inert atmosphere in order to densify the metal thus deposited in the trenches.

Figure 4D:
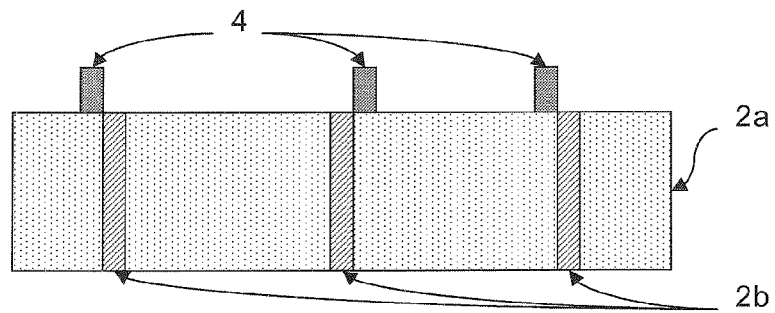

Next, referring to FIG. 4D, a resist mask 4 is deposited on the layer of the first material 2a. This mask is deposited selectively so as to cover the portions of the first material 2a that it is desired to preserve in the final cellular structure 2. The portions are adjacent to the trenches filled with the second material 2b, so as to constitute bimaterial strips therewith. Typically, they have a width of around 10 µm. The resist mask is intended to protect the first material 2a adjacent to the second material 2b during the etching step that follows.

Figure 4E:
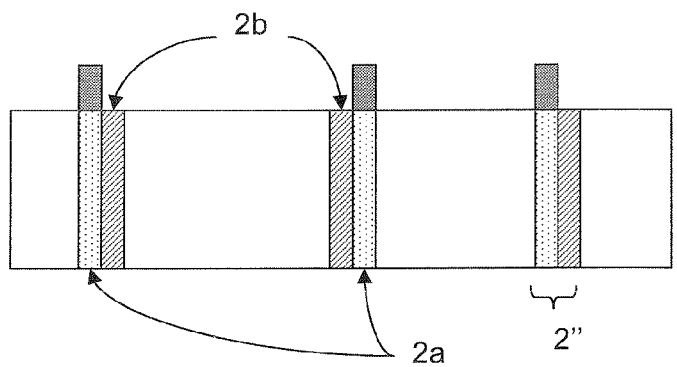

Referring to FIG. 4E, the first material 2a not protected by the mask 4 is etched, the etching being selective to remove only first material 2a but not the second material 2b. In the final step, not illustrated here, the mask 4 is removed. A cellular structure consisting of a plurality of open cells 2', the walls 2" of which are bimaterial strips 2a, 2b, is therefore obtained. The structure is then bonded to the surface of the substrate 1 by any appropriate bonding method. Typically, an adhesive that adheres to the substrate is used In the case described, the structure is fabricated independently of the substrate and then bonded thereto. It would also be possible, however, to bond to or deposit on the surface of the substrate of the layer of the first material 2a and to apply a process, similar to that described above for fabricating the cellular structure, to this layer. Thus, the layer of the first material 2a may be deposited on the surface of the substrate 1 by sputtering or, preferably, by CVD (chemical vapour deposition) or by an electrochemical method, before carrying out the etching operation that will allow the cellular structure to be formed.

Before bonding the cellular structure or for depositing the first material 2a from which the cellular structure will be formed, it is advantageous to prepare the surface of the substrate in order to promote bonding to the stress-generating structure and/or to protect it from any contamination by the materials constituting the stress-generating structure. For example, a protective layer of silicon oxide having a thickness of around 500 nanometers may be formed on the substrate, this protective layer being deposited by a CVD technique or formed by thermal oxidation if the substrate is made of silicon.

It is also possible to form a tie layer of titanium or other metals on the substrate surface by a flash evaporation step to provide a thickness of 100 to 300 ångstroms on the substrate surface to promote secure bonding to the metal of the bimaterial strips of the stress-generating structure. Commercially available adhesives can be organic or inorganic and deposited on one or both surfaces to be bonded. Adhesives especially the widely established SU-8 and benzocyclobuten (BCB) are specialized for such purposes. Other adhesives?

Another bonding material is an amorphous silicon film is used as an interlayer between the substrate and cellular structure. A poly-silicon film or silicide can also be used for this purpose. The film of bonding material can be deposited onto stress-generating structure either before or after formation of the cells optionally with annealing to ensure a strong interface between the structure and the film. Thereafter, the structure can be bonded to the silicon substrate as this involves the bonding of two similar materials, resulting in strong adhesion of the structure to the silicon.

Moreover, devices are formed in or on the film to be detached, the surface of the substrate is no longer planar and suitable for bonding to the stress-generating structure. A layer of $SiO_2$ is therefore deposited on the surface to above the height of the devices, the layer then being planarized, for example by polishing, for the purpose of providing a flat surface with the devices embedded therein such that the flat surface can facilitate bonding to the stress-generating structure. After the cleaving operation, it is possible to remove the oxide layer by etching, thereby making it easier to remove the stress-generating structure.

FIG. 3 illustrates a top view (i.e. along a direction perpendicular to the surface of the substrate 1) of the straight/cellular-structure assembly obtained. When applying the heat treatment, the second material 2b of the bimaterial strip extends more than the first material, because its thermal expansion coefficient is higher, thereby generating a tension, and the walls of each cell 2' stretch until becoming substantially straight. Since the walls of the cells are bonded to the surface of the substrate, the elongation results in the application of a stress within the substrate, causing it to be cleaved.

The stresses are therefore not transmitted uniformly to the substrate, but in localized fashion by each bimaterial strip. In other words, each bimaterial strip 2a, 2b exerts a discrete stress on the substrate to which it is bonded, and all the discrete stresses thus exerted combine to generate an overall stress higher than the mechanical strength of the material of the substrate in the cleavage plane C.

Examples of Pairs of Materials Employed

The materials constituting the bimaterial strip must have expansion coefficients as different as possible. A ratio of about 2 or more between thermal expansion coefficients of the two materials is desirable.

Thus, when one of the materials of the bimaterial strip is silicon (the TEC at 25° C. of which is around $4.6 \times 10^{-6}$ $K^{-1}$), the other material is advantageously chosen from silver (TEC around $18 \times 10^{-6}$ $K^{-1}$), aluminium (TEC around $23 \times 10^{-6}$ $K^{-1}$) or even copper (TEC around $16.5 \times 10^{-6}$ $K^{-1}$). In these cases, a structure is obtained in which the silicon expands significantly less than the other material. It is also possible to devise a structure that behaves the opposite way, using, to form the bimaterial strip, silicon and a material having a thermal expansion coefficient substantially lower than that of silicon. This is the case in particular for silicon oxide ($SiO_2$) and silicon nitride ($Si_xN_y$).

It is also possible to use germanium (TEC around $6.1 \times 10^{-6}$ $K^{-1}$) for one of the materials of the bimaterial strip and one of the abovementioned metals or even iron (TEC around $11.8 \times 10^{-6}$ $K^{-1}$) for the other material. As a variant, sapphire may be chosen for one of the materials of the bimaterial strip and one of the abovementioned metals for the other material. Finally, it is possible to use for one of the materials of the bimaterial strip a material having a negative thermal expansion coefficient (such as zirconium tungstate $ZrW_2O_8$) combined with a material having a positive thermal expansion coefficient (silver, for example).

The advantage of such a bimaterial strip is that it is not necessary to heat it strongly in order to obtain a large deformation, thereby making it particularly appropriate for cleaving silicon at a temperature below 500° C., in which silicon is brittle. It is also possible to produce a cellular structure whose walls are trimaterial strips, in which the first and second materials forming a bimaterial strip are a material having a high positive thermal expansion coefficient (such as silver) and a material having a negative thermal expansion coefficient, respectively, these being separated by a third material such as silicon. The silicon, which has an intermediate thermal expansion coefficient, applies such a structure with stability and mechanical strength.

Alternatively, a cellular structure may be formed with trimaterial strip walls in which the first and second materials forming a bimaterial strip are separated by a cavity. Such structures are described in the publications by O. Sigmund and S. Torquato "Composites with extremal thermal expansion coefficients", Appl. Phys. Lett. 69(21), 18 Nov. 1996 and "Design of materials with extreme thermal expansion using a three-phase topology optimization method", J. Mech. Phys. Solids, Vol. 45, No. 6, pp. 1037-1067, 1997.

Magnetostrictive Cellular Structure

According to one particularly advantageous embodiment of the present invention, the stress-generating structure is also designed to deform under the effect of a magnetic field. For this purpose, one of the constituent materials of the bimaterial strips is a magnetostrictive material, while still having a thermal expansion coefficient significantly different from that of the other constituent material of the bimaterial strip. Preferably, the magnetostrictive material is chosen from materials having an elongation of greater than 0.02% in absolute value and preferably a material exhibiting what is called "giant" magnetostriction, i.e. having a magnetostriction coefficient of greater than 50 ppm in absolute value. To achieve this, materials based on rare-earth/iron alloys are selected as they are known to exhibit such properties.

One example of a magnetostrictive material very suitable for implementing the invention is terfenol-D, which is a rare-earth/iron alloy having the formula $Tb_{0.3}Dy_{0.7}Fe_{19}$, which can be used in polycrystalline form or amorphous form. The magnetostriction coefficient is different for each form (crystalline and amorphous), but remains greater than 50 ppm. In its crystalline form, the elongation under the effect of a magnetic field may be up to 0.2% and generate compressive stress fields of around 1 kN/cm. Other rare-earth/iron alloys, such as SmFe$_2$ with a negative elongation, and DyFe$_2$ and TbFe$_2$ with a positive elongation, are also very suitable for implementing the invention.

The other material of the bimaterial strip is then typically silicon, SiC or germanium. The cellular structure may be fabricated by the same process as that described above. To give an example, a structure may be formed that has walls consisting of silicon/terfenol-D bimaterial strips in which the thickness of the silicon strip is 50 microns and the thickness of the terfenol-D strip is 15 microns.

The structure thus formed is capable of deforming under the combined effect of temperature (which may then be lower than in the case in which only the heat treatment is used to deform it) and of a magnetic field. The overall deformation of such a cellular structure is greater than the intrinsic deformation of the magnetostrictive material under the effect of the magnetic field. For example, the relative increase in the dimensions of the structure may be from 10 to 100 times greater than the relative elongation of the magnetostrictive material. This amplification factor depends on the geometric design of the cells and on their lattice arrangement. This amplification makes it possible, for a given expansion or contraction of the stress-generating structure, to apply a lower-temperature heat treatment compatible with the presence of electronic devices that are very sensitive to the temperature in or on the substrate, compared with the previous embodiment in which the structure expands or contracts only due to the effect of temperature. To cleave the substrate with such a structure, a heat treatment and a magnetic field are applied simultaneously.

The temperature applied must remain significantly below the Curie temperature $T_c$ of the magnetostrictive material so as not to impair the magnetic properties of the stress-generating structure. In the case of terfenol-D, the Curie temperature is 380° C., so that the heat treatment will not be applied at a temperature above 350° C. and will preferably be applied at a temperature below 300° C. As regards DyFe$_2$, SmFe$_2$ and TbFe$_2$, the Curie temperature is between 630 and 710° C. and the heat treatment will therefore be applied at a temperature preferably below 600° C.

Figure 5:
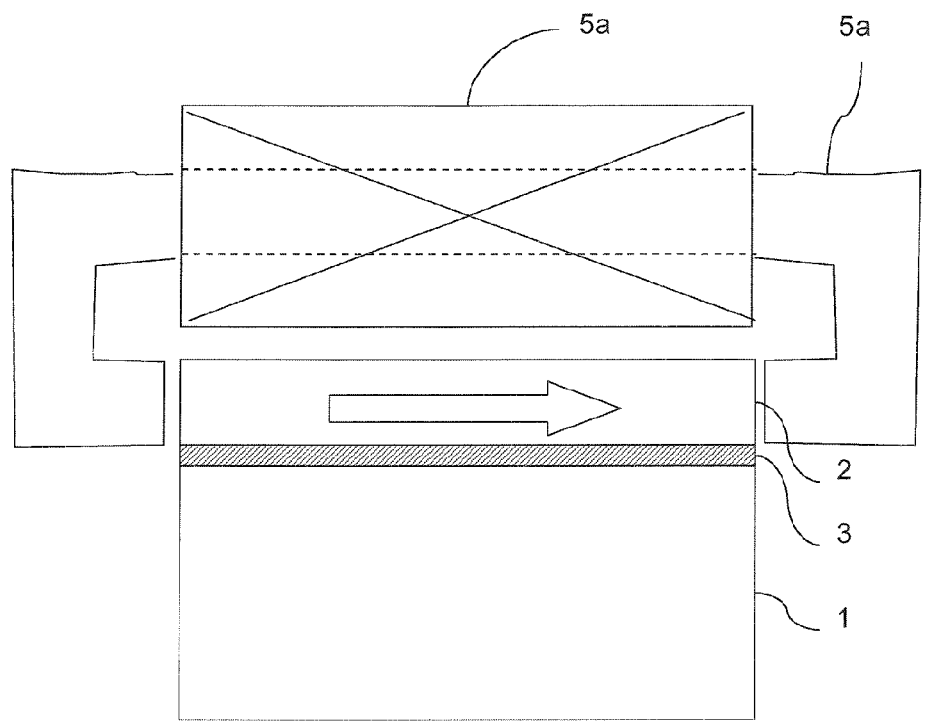
FIG. 5 is a sectional view showing schematically the application of a magnetic field to the stress-generating structure.

Referring to FIG. 5, the magnetic field is applied by means of a magnetic circuit 5a surrounding the stress-generating structure 2, the magnetic circuit being surrounded by a conducting coil 5b. As shown by the horizontal arrow, this device generates a magnetic induction parallel to the surface of the substrate. If the substrate has an elongate shape, i.e. the ratio of the dimensions of the substrate along two perpendicular directions in a plane parallel to the surface (the substrate then possibly being considered to be one-dimensional) is at least 10, the applied magnetic field is preferably static and oriented parallel to the longest dimension of the substrate.

If the dimensions of the substrate along two perpendicular directions in a plane parallel to its surface are of the same order of magnitude (for example when the substrate takes the form of a disc), the magnetic field is applied in the form of a combination of variable fields creating a rotating magnetic induction in the plane of the substrate so as to cause expansion along the two directions of the stress-generating structure. The magnetic induction needed is typically between 0.1 and 1 tesla.

One advantage of the magnetic treatment is that it can be carried out with no contact either with the stress-generating structure or with the substrate to be cleaved, thereby facilitating the implementation thereof.

Preweakening of the Substrate

According to one particular embodiment of the invention, the substrate may be weakened before applying the heat treatment (and, where appropriate, the magnetic field), for the purpose of facilitating cleavage thereof.

Figure 6:
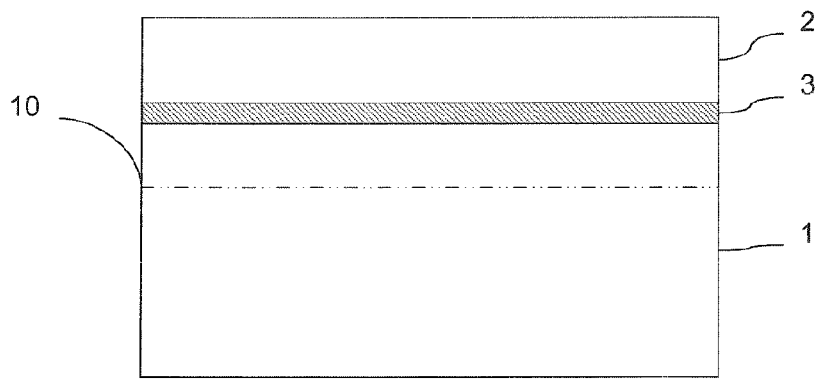
FIG. 6 is a sectional view of one embodiment of the invention in which the substrate to be cleaved has been preweakened.

As illustrated in FIG. 6, a weakened zone 10 is formed in the substrate in a plane corresponding to the cleavage plane. The weakening may result from an ion implantation optionally combined with heat treatments, possibly resulting in the creation of pores and/or microbubbles in a plane corresponding to the cleavage plane. In this case, the implanted ion dose is much smaller than that needed to form a weakened zone to bring about fracture in a SmartCut™ process by a factor of about 10. For example, the ion implantation dose for the SmartCut™ process that creates a weakened zone at a depth of 20 microns in silicon is approximately $10^{17}$ atoms/cm$^2$, whereas the dose needed for preweakening according to the present invention is around $5\times10^{15}$ to $10^{16}$ atoms/cm$^2$.

The weakening treatment may also be carried out during production of the substrate. Thus, for example, a weakened zone may be formed by an epitaxially grown layer of Si$_x$Ge$_{1-x}$ (where 0<x<0.8) of 2 μm thickness on a silicon substrate, this layer having a maximum germanium content (up to 20%) at the center of the layer and decreasing down to about 5% on approaching the upper and lower interfaces.

Grown epitaxially on the layer is another, silicon layer 20 μm in thickness for example. The germanium gradient in the Si$_x$Ge$_{1-x}$ layer is chosen to allow epitaxial growth with sufficient crystal quality (i.e. a lower dislocation density and absence of cracking) of the subjacent Si layer which is intended to be subsequently detached. This concentration gradient is possible in fact of the Si$_x$Ge$_{1-x}$ lattice parameter to be continuously matched to that of the subjacent silicon without creating stress relaxation in the layer by forming dislocations. The Si$_x$Ge$_{1-x}$ layer is mechanically more brittle than the subjacent and superjacent layers of silicon and cleavage will take place within the Si$_x$Ge$_{1-x}$ layer.

Fracture Initiator in the Substrate

Alternatively, the cleaving operation may be facilitated by providing a fracture initiator in the substrate at the desired depth.

Figure 7:
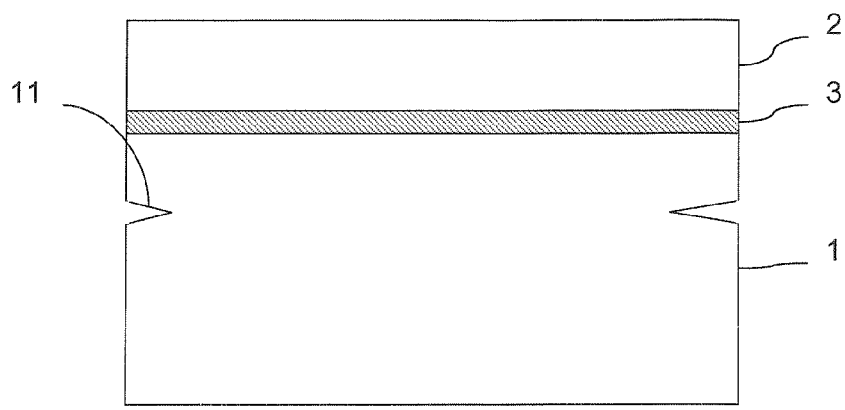
FIG. 7 is a sectional view of an alternative embodiment in which a fracture initiator is produced in the substrate to be cleaved.

As illustrated in FIG. 7, the fracture initiator may take the form of a notch 11 (typically a few tens of microns in depth) made on a lateral face of the substrate 1, at the depth corresponding substantially to the depth at which the stress-generating structure has to induce fracture (the abovementioned plane C). Such an initiator makes it possible, in a range of depths where the stress is very high, for the location of the fracture in the substrate to be precisely located. It also makes it possible to reduce the stress field to be applied for the cleavage and therefore the temperature and, where appropriate, the magnetic induction.

The fracture initiator may be produced by mechanical means, using a cutting tool, and/or by chemical means. For example, for a wafer of n-type silicon that includes a layer of p$^+$-doped silicon with a thickness of about 2 microns, which corresponds to the desired fracture depth, selective etching using pyrocatechol is carried out at the periphery of the p$^+$-doped silicon layer in order to form a notch. The depth of this notch depends on the duration of the chemical etching. Typically, when etching for 10 minutes in a bath with stirring, a notch having a depth of around fifty microns may be formed.

EXAMPLE

To cleave a silicon substrate, a cellular structure as illustrated in the top view in FIG. 3 is first formed.

The walls of the cells are formed from a silicon 2a/silver 2b bimaterial strip.

The width of the silicon and silver strips is about 10 microns.

The thickness (in a direction perpendicular to the surface of the substrate) of the cellular structure is about 40 microns.

Each cell is inscribed in a circle of 100 microns in diameter, each side of the cell having a length of about 50 microns and being curved with a sag of about 10 microns.

To avoid potential contamination of the substrate by silver from the bimaterial strip, it is preferred to form a protective oxide layer on the surface of the silicon substrate before bonding the structure to the substrate, the oxide layer possibly being removed after cleavage of the substrate and removal of the structure from the detached film.

This cellular structure is bonded to the surface of the substrate by a direct bonding process capable of providing a high adhesion energy density right from room temperature, for example an adhesion process with the surfaces prepared by plasma treatment. It is known that this type of treatment enables adhesion energy densities of several hundred $mJ/m^2$ to be obtained.

The adhesion process, i.e. the increase in adhesion energy, will then be carried out by raising the temperature of the assembly using a rate of temperature rise with a temperature that is sufficiently slow (typically 5° C./min) in order for the adhesion process to be completely finished before any parasitic effect of the deformation of the cellular structure can be exerted substantially at the bonding interface.

The assembly is then heated to a temperature of about 450° C.

This temperature is sufficiently modest for the silver of the bimaterial strip not to contaminate the substrate through the aforementioned protective layer.

Under the effect of this heating, the silver strip extends more than the silicon strip, thereby causing the curved walls to stretch until they are substantially straight.

This deformation generates a stress in the silicon substrate that enables it to be cleaved at a depth of between 50 and 100 microns.

What is claimed is:

1. A process for cleaving a substrate for the purpose of detaching a film therefrom, which comprises:
    forming an assembly of a stress-generating structure locally bonded to a substrate surface and designed to expand or contract in a plane parallel to the substrate surface under the effect of a heat treatment, wherein the stress-generating structure is a cellular structure having a plurality of open cells, the walls of the which are perpendicular to the substrate surface; and
    applying a heat treatment to the structure under time and temperature conditions sufficient to cause the structure to expand or contract so as to generate a plurality of local stresses therein which generates a stress greater than the mechanical strength of the substrate in a cleavage plane oriented parallel to the substrate surface and at a depth in the substrate to define a film to be detached, with the stress facilitating cleavage of the substrate at the cleavage plane to detach the film from the substrate.

2. The process according to claim 1, wherein the walls of the stress-generating structure are composed of at least two materials having different thermal expansion coefficients designed to allow the walls to deform under the effect of the heat treatment to generate the stresses.

3. The process according to claim 2, wherein the cell walls comprise bimaterial strips formed from first and second materials that have thermal expansion coefficients differing by a ratio of at least 2.

4. The process according to claim 3, wherein the bimaterial strips are formed from the following pairs of materials: Si/Ag, Si/Al, Si/Cu, Si/SiO$_2$, Ge/Ag, Ge/Al, Ge/Cu, Ge/Fe, Ge/SiO$_2$, sapphire/Ag, sapphire/Al, sapphire/Cu, or sapphire/SiO$_2$.

5. The process according to claim 3, wherein the bimaterial strips are formed from first and second materials, one having a positive thermal expansion coefficient and the other a negative thermal expansion coefficient.

6. The process according to claim 5, wherein the bimaterial strips are formed from the following pairs of materials: Si/ZrW$_2$O$_8$, Cu/ZrW$_2$O$_8$, Al/ZrW$_2$O$_8$ and/or Ag/ZrW$_2$O$_8$.

7. The process according to claim 3, wherein the first and second materials of the bimaterial strips are separated by a void or by a strip of a third material.

8. The process according to claim 1, wherein the heat treatment is applied at a temperature of between 20 and 500° C.

9. The process according to claim 1, wherein one of the materials of the cell walls is a magnetostrictive material that is designed to expand or contract under the action of a magnetic field, and the process further comprises applying a magnetic field along with the heat treatment to cause cleavage of the substrate at the cleavage plane.

10. The process according to claim 9, wherein the magnetostrictive material is terfenol-D, SmFe$_2$, DyFe$_2$, TbFe$_2$, or another rare-earth/iron alloy, and the other material pf the cell walls is silicon, SiC or germanium, and wherein the heat treatment is applied at a temperature below the Curie temperature of the magnetostrictive material and in that a magnetic field is also applied to the structure, suitable for causing the magnetostrictive material to elongate or contract.

11. The process according to claim 9, wherein the substrate has an elongate shape and in that the applied magnetic field is static and oriented parallel to the largest dimension of the substrate, or wherein the substrate is in the form of a disc and in that the applied magnetic field is a rotating field.

12. The process according to claim 1, wherein the stress-generating structure is bonded to the surface of the substrate by a bonding layer or adhesive.

13. The process according to claim 3, wherein the stress-generating structure, before being bonded to the surface of the substrate, is fabricated by etching trenches in a layer of the first material, filling the trenches with the second material, masking portions of the layer of the first material that are intended to form the bimaterial strips, and selectively etching the layer so as to remove the non-masked portions of the first material.

14. The process according to claim 2, wherein the stress-generating structure is bonded to the substrate by depositing a layer of the first material onto the surface of the substrate, followed by etching trenches in the layer of the first material, filling the trenches with the second material, masking portions of the layer of the first material that are intended for forming the bimaterial strip, and the selectively etching the layer so as to remove the non-masked portions of the first material.

15. The process according to claim 1, wherein the film to be detached from the substrate has a thickness between 1 and 100 microns, and the process further comprises providing a the stress-generating structure at a thickness such that a ratio of the thickness of the film to be detached to the thickness of the stress-generating structure is between 0.1 and 10.

16. The process according to claim 1, wherein, before applying the heat treatment, the process further comprises providing a weakened zone in the substrate so as to cause the cleavage through the weakened zone.

17. The process according to claim 16, wherein the weakened zone is formed by ion implantation in the substrate at the depth of the cleavage plane with a dose of between $5\times10^{15}$ and $10^{16}$ atoms/cm$^2$.

18. The process according to claim 16, wherein the substrate and the film to be detached are made of silicon and in that the weakened zone is a layer of Si$_x$Ge$_{1-x}$ where $0<x<0.8$, in which the proportion of germanium gradually changes between a minimum value at the interfaces and a maximum value at the center.

19. The process according to claim 1, wherein, before the application of the heat treatment, the process further comprises providing a fracture initiator in the substrate at the depth of the cleavage plane, wherein the fracture initiator is a notch, tranch, channel or other discontinuity in the substrate.

20. The process according to claim 1, wherein, before forming the stress-generating structure, electronic devices are formed in or on the film to be detached from the substrate, the devices being for optoelectronic and/or photovoltaic or power applications or for electronic circuits or for microsystems.

21. The process according to claim 1, wherein the substrate is made of a semiconductor material and the process further comprises removing the stress-generating structure from the film after detachment from the substrate and recycling the stress-generating structure after removal from the detached film for repeating the process.

\* \* \* \* \*

UNITED STATES PATENT AND TRADEMARK OFFICE
CERTIFICATE OF CORRECTION

| | | |
|---|---|---|
| PATENT NO. | : 8,420,506 B2 | Page 1 of 1 |
| APPLICATION NO. | : 13/306591 | |
| DATED | : April 16, 2013 | |
| INVENTOR(S) | : Bruel | |

It is certified that error appears in the above-identified patent and that said Letters Patent is hereby corrected as shown below:

In the Claims:

Column 14:
Line 55 (claim 14, line 7), change "strip," to -- strips, --.

Column 15:
Line 15 (claim 19, line 5), change "tranch," to -- trench, --.

Signed and Sealed this
Twenty-first Day of May, 2013

Teresa Stanek Rea
*Acting Director of the United States Patent and Trademark Office*